United States Patent [19]

Coppens et al.

[11] Patent Number: 5,068,165

[45] Date of Patent: Nov. 26, 1991

[54] LITHOGRAPHIC ALUMINUM OFFSET PRINTING PLATE MADE ACCORDING TO THE DTR-PROCESS

[75] Inventors: Paul J. Coppens, Turnhout; Ludovicus H. Vervloet, Kessel; Luc H. Leenders, Herentals; Ronald Schuerwegen, Schelle, all of Belgium

[73] Assignee: AGFA-Gevaert, N.V., Mortsel, Belgium

[21] Appl. No.: 552,945

[22] Filed: Jul. 16, 1990

[30] Foreign Application Priority Data

Jul. 25, 1989 [EP] European Pat. Off. ......... 89201960.5

[51] Int. Cl.$^5$ .............................................. G03C 5/54
[52] U.S. Cl. ...................... 430/204; 430/230; 430/231; 430/256; 430/259; 430/262; 430/263; 430/526; 430/525
[58] Field of Search ............... 430/204, 231, 262, 263, 430/525, 526, 259, 230

[56] References Cited

U.S. PATENT DOCUMENTS

| | | | |
|---|---|---|---|
| 3,424,580 | 1/1969 | Wainer | 430/231 |
| 3,511,656 | 5/1970 | Regan et al. | 430/204 |
| 3,552,316 | 1/1971 | Ormsbee | 430/204 |
| 3,628,978 | 12/1971 | Yackel | 430/204 |
| 3,989,521 | 11/1976 | De Haes et al. | 430/204 |
| 4,018,605 | 4/1977 | Olsen | 430/204 |
| 4,425,420 | 1/1984 | De Jaeger et al. | 430/231 |
| 4,640,886 | 2/1987 | Miller et al. | 430/525 |
| 4,686,170 | 8/1987 | Vermeulen et al. | 430/204 |
| 4,772,535 | 9/1988 | Kamano et al. | 430/204 |

Primary Examiner—Richard L. Schilling
Attorney, Agent, or Firm—Breiner & Breiner

[57] ABSTRACT

Method for making lithographic aluminium offset printing plates according to the DTR-process by photoexposing a photosensitive monosheet layer assemblage comprising a hydrophilic aluminium foil, a water-swellable intermediate layer comprising a non-protenic hydrophilic film-forming polymer, and a silver halide emulsion layer, applying an aqueous alkaline solution thereto in the presence of a developing agent and a silver halide solvent, allowing to reduce the photoexposed silver halide, allowing the unreduced silver halide or complexes thereof to diffuse to said aluminium foil to form a silver image thereon, and separating said emulsion layer and said intermediate layer from the image aluminium foil. The invention also relates to the photosensitive monosheet layer assemblage used for making such printing plates.

29 Claims, No Drawings

LITHOGRAPHIC ALUMINUM OFFSET PRINTING PLATE MADE ACCORDING TO THE DTR-PROCESS

BACKGROUND OF THE INVENTION

1. Field of the Invention

The present invention relates to a method for making improved lithographic aluminim offset printing plates according to the silver complex diffusion transfer reversal process and to the photosensitive monosheet layer assemblage used for making such printing plates.

2. Description of the Prior Art

The principles of the silver complex diffusion transfer reversal process, briefly called DTR-process herein, have been described in e.g. U.S. Pat. No. 2,352,014.

In U.S. Pat. No. 3,424,580 a DTR-process has been described, according to which a positive image is made on an anodized aluminium surface that is free from traces of sulphate, said process comprising image-wise exposing a light-sensitive element comprising a paper support and a silver halide emulsion and then developing the resulting latent image in the presence of a silver halide solvent while said image-wise exposed silver halde emulsion layer is in close physical contact with said anodized aluminium surface. According to this process the light-sensitive element and the anodized aluminium are attached to each other by a plastic hinge. During the image-wise exposure the hinged assembly has to be opened to allow the exposure of the light-sensitive silver halide emulsion layer to take place and in a subsequent step to allow wetting of the anodized aluminium surface with developer (not of the still light-sensitive emulsion layer comprising a latent image). Next, the assembly has to be closed to allow the diffusion transfer to take place from the emulsion layer to the aluminium surface. The purpose of the described process is merely to form a silver image on an aluminium surface, the imaged aluminium not serving for printing purposes. The described process has the disadvantage that it requires the use of a two-sheet assembly, which is difficult in handling during exposure as well as during development.

A lithographic printing plate can be made according to the DTR-process. In U.S. Pat. No. 3,511,656 a method has been described for making a printing plate by emulsion layer, a silver-receptive stratum containing nuclei for precipitation of silver from diffusing water-soluble silver complexes, and a base sheet e.g. an aluminium foil, and applying an aqueous alkaline solution of a developing agent and silver halide solvent to the photo-exposed silver halide emulsion layer, reducing the exposed silver halide, allowing the unreduced silver halide or complexes formed thereof to diffuse from the unexposed areas of the silver halide emulsion layer to the silver-receptive stratum to produce from the unreduced silver halide or complexes formed thereof in conjunction with the nuclei a visible silver image in the silver-receptive stratum, said image being oleophilic ink-receptive, removing the photo-exposed silver halide emulsion layer from the surface of the silver-receptive stratum with warm water, wetting the imaged silver-receptive stratum with aqueous dampening liquid to wet out the non-imaged areas, coating the silver-receptive stratum with an ink, which wets out the imaged areas, and pressing the inked surface onto copy sheets for the transfer of the ink image thereto. It is possible also to dispense with the silver-receptive stratum containing nuclei so that the oleophilic ink-receptive image is formed directly on the base sheet e.g. an aluminium foil, the surface of which has been rendered hydrophilic previously by brushing, silicating, anodizing, etching, or the like. By treatment with a lacquer the oleophilicity of the silver image can be increased, if desired.

In U.S. Pat. No. 4,772,535 a light-sensitive lithographic printing plate material has been described, which material comprises a support e.g. a metal support, an optional subbing or antihalation layer or undercoat, a non-light-sensitive silver halide emulsion layer, a light-sensitive silver halide emulsion layer, and an image-receiving layer containing physical development nuclei. The material is exposed image-wise through the image-receiving layer and developed to form a diffusion transfer silver image in the image-receiving layer (not in the metal support). The imaged element thus obtained is used as such as a printing plate without separation of the now useless emulsion layers from the layer that contains the printing image.

According to EP-A 0,278,766 a lithographic printing plate precursor has been proposed, said precursor comprising a grained and anodized aluminium foil coated with a sol containing nuclei in a gelatin binder and—according to one embodiment—covered with a silver halide emulsion layer. Extensive experimentation with a said printing plate precursor has shown unfortunately that satisfactory printing results can only be obtained on the condition that after development of said precursor, the residual emulsion layer is removed by washing with hot water (50° C.) and that the image plate is treated with a finisher comprising large amounts (20 g/l) of trypsin. The use of hot water has several disadvantages. The cost of hot water is high. Moreover, hot water dissolves the proteinic binder, usually gelatin, of the emulsion layer, thus causing decomposition of said layer so that a dirty black waste water comprising silver particles and dissolved silver salts is obtained, which upon cooling may clog filters and draining pipes. As for trypsin, this is a proteolytic enzyme that should be present in the finisher to degrade or decompose the proteinic binder that has adsorbed onto the silver grains precipitating on the aluminium foil during image formation. Substantial amounts of proteinic binder can indeed easily reach the silver grains owing to the fact that a silver-receptive stratum comprising gelatin and a gelatin silver halide emulsion layer have been coated directly on the aluminium foil. After oleophilization of said silver image the adsorbed gelatin, which is inherently hydrophilic, constitutes an undesired hydrophilic element in the master image so that prints having an insatisfactory quality are obtained. Moreover, said trypsin, which is essential to degrade the proteinic binder in the silver image, is extraordinarily expensive and is ecologically harmful as can be derived from i.a. Sigma Aldrich Library of Chemical Safety Data:MSD Book, 2,35553A,B,C and from Registry of Toxic Effects of Chemical Substances, YN507500.

In addition to the above disadvantages it has also been established that the gelatin present in substantial amounts in the nuclei-containing layer and in the emulsion of the lithographic printing plate precursor layer has a corrosive effect on the aluminium foil. The corrosive effect of gelatin on aluminium has indeed been described by J. H. Penn and G. A. W. Murray in Br. Corros. J., 1967, Vol. 2, September, pages 193–4. Even though the corrosive influence of gelatin on the aluminium foil may be limited thanks to the presence of the anodization layer thereon, this protection is incomplete owing to random defects in the continuity of the anodization layer.

Owing to electromotive force existing between the aluminium and the silver metal in close contact therewith, corrosion can be caused in the silver image areas. In spite of the barrier effect of the anodized surface to this process corrosion can occur in various parts of the image corresponding to anodic faults. As a result, corrosion specks are formed, which appear as pin-holes surrounded by a region of weakly adhered silver. These corrosion defects, even though their effect may be reduced by treatment with corrosion inhibitors, lead to unsatisfactory printing quality.

Furthermore, it is generally known that aluminium ions have a hardening influence on gelatin (see e.g. the paragraph bridging pages 78 and 79 of "The Theory of the Photographic Process" 4th Ed., edited by T. H. James). Aluminium ions of the foil can indeed cause a hardening reaction in the gelatin layers so that removal of the emulsion layer gradually becomes more difficult.

Finally, as a result of the corrosive effect of gelatin on aluminium and the hardening reaction caused by aluminium in the gelatin layer, the shelf-life of the lithographic printing plate precursor is limited substantially.

SUMMARY OF THE INVENTION

It is therefore an object of the present invention to provide an improved method for making lithographic aluminium printing plates according to the DTR-process in a convenient and ecologically as well as economically acceptable way.

It is another object of the present invention to provide a photosensitive monosheet layer assemblage for making a lithographic aluminium printing plate, by which prints having a high quality can be made according to the DTR-process.

These and other objects are achieved by providing an improved method for making lithographic aluminium offset printing plates according to the DTR-process comprising the steps of:

(a) photo-exposing a photosensitive monosheet layer assemblage comprising a hydrophilic grained and anodized aluminium foil, a water-swellable intermediate layer coated at a ratio of 0.01 to 2.0 g/m2 and comprising for at least 70% of its total weight at least one non-proteinic hydrophilic film-forming polymer, and at least one silver halide emulsion layer, (b) applying an aqueous alkaline solution to the photo-exposed silver halide emulsion layer in the presence of at least one developing agent and at least one silver halide solvent, thus reducing the photo-exposed silver halide and allowing the unreduced silver halide or complexes formed thereof to diffuse from the unexposed areas of the silver halide emulsion layer to said hydrophilic grained and anodized aluminium foil to produce from the unreduced silver halide or complexes formed thereof a silver image on said hydrophilic grained and anodized aluminium foil, and (c) separating said at least one emulsion layer and said water-swellable intermediate layer from the imaged hydrophilic grained and anodized aluminium foil.

In the above step (c) said separating can be accomplished e.g. by the steps of:

bringing said monosheet layer assemblage with its side showing said at least one emulsion layer during the period of time starting with the application of said aqueous alkaline solution and ending with said formation of a silver image on said hydrophilic grained and anodized surface in contact with a receiving means, said at least one emulsion layer and said water-swellable intermediate layer being wet with said aqueous alkaline solution having an adherence to said receiving means that is stronger than that to the imaged hydrophilic grained and anodized aluminium foil and peeling off said at least one emulsion layer and said water-swellable intermediate layer adhering to said receiving means from the imaged hydrophilic grained and anodized aluminium foil, or by the steps of:

removing said monosheet layer assemblage from the alkaline solution-applying means after completion of said formation of a silver image on said hydrophilic grained and anodized aluminium foil and detaching said at least one emulsion layer and said water-swellable intermediate layer from the imaged hydrophilic grained and anodized aluminium foil with the aid of unheated water or unheated aqueous medium, or by the steps of:

removing said monosheet layer assemblage from the alkaline solution-applying means after completion of said formation of a silver image on said hydrophilic grained and anodized aluminium foil and detaching said at least one emulsion layer and said water-swellable intermediate layer, while still being wet with alkaline solution or while being wet with unheated water or an unheated aqueous medium applied thereto subsequent to the removal of said monosheet layer assemblage from said alkaline solution, from the imaged hydrophilic grained and anodized aluminium foil with the aid of an air current directed onto an edge of said monosheet layer assemblage.

The imaged hydrophilic grained and anodized aluminium foil can be used for making prints as follows:

treating said imaged aluminium foil by rubbing with a fixer to enhance the water-receptivity of the non-image areas and to make the image areas oleophilic ink-receptive, wetting said imaged aluminium foil with an aqueous dampening liquid to wet out the non-imaged areas, coating said imaged aluminium foil with an ink that wets out the imaged areas, and pressing the inked surface of the resulting lithographic aluminium offset printing plate in an offset press onto a blanket that transfers the ink onto copy sheets.

The present invention also provides a photosensitive monosheet layer assemblage for making a lithographic aluminium printing plate according to the DTR-process, said assemblage comprising in the given sequence a hydrophilic grained and anodized aluminium foil and at least one silver halide emulsion layer, wherein a water-swellable intermediate layer coated at a ratio of 0.01 to 2.0 g/m2 is provided between said hydrophilic grained and anodized aluminium foil and said at least one silver halide emulsion layer, said water-swellable intermediate layer comprising for at least 70% of its total weight at least one non-proteinic hydrophilic film-forming polymer.

The photosensitive monosheet layer assemblage according to the present invention can be made by coating a hydrophilic grained and anodized surface of an aluminium foil with a water-swellable intermediate layer at a ratio of 0.01 to 2.0 g/m2, said water-swellable intermediate layer comprising for at least 70% of its total weight at least one non-proteinic hydrophilic film-forming polymer, and coating said water-swellable intermediate layer with at least one silver halide emulsion layer.

According to another embodiment the said photosensitive monosheet layer assemblage can be prepared by the steps of:

coating a temporary base with at least one silver halide emulsion layer, coating said at least one silver halide emulsion layer with a water-swellable intermediate layer at a ratio of 0.01 to 2.0 g/m2, said water-swellable intermediate layer comprising for at least 70% of its total weight at least one non-proteinic hydrophilic film-forming polymer, and pressing the thus formed photosensitive layer packet with its side carrying said water-swellable intermediate layer against the hydrophilic grained and anodized surface of an aluminium foil, which has been wet with an aqueous moistening liquid, the said temporary base being removed before or after said photo-exposure.

The invention thus also provides a photosensitive layer packet intended for making a lithographic aluminium printing plate according to the DTR-process, wherein said photosensitive layer packet comprises a temporary base temporarily carrying a separable layer sandwich comprising in the given sequence at least one silver halide emulsion layer and a water-swellable layer coated at a ratio of 0.01 to 2.0 g/m2, said water-swellable layer comprising for at least 70% of its total weight at least one non-proteinic hydrophilic film-forming polymer and said layer sandwich being transferable onto a wet separate hydrophilic grained and anodized aluminium foil when pressed thereon. The temporary base can be peeled off before or after photo-exposure of the silver halide emulsion layer(s).

DETAILED DESCRIPTION OF THE INVENTION

The method of the invention for making prints according to the DTR-process by means of an improved lithographic aluminium offset printing plate comprises the consecutive steps of:

(1) making a photosensitive monosheet layer assemblage e.g. by the steps of:

coating the hydrophilic grained and anodized surface of an aluminium foil, preferably after having applied thereto a silver-receptive stratum containing development nuclei for precipitation of silver from diffusing water-soluble silver complexes, with a water-swellable intermediate layer at a ratio of 0.01 to 2.0 g/m2, said water-swellable intermediate layer comprising for at least 70% of its total weight at least one non-proteinic hydrophilic film-forming polymer and preferably comprising an antihalation dye or pigment, and coating said water-swellable intermediate layer with at least one silver halide emulsion layer, at least one silver halide emulsion layer being photosensitive and optionally comprising a light-screening dye, or by the steps of:

coating a temporary base, preferably a cellulose triacetate film base, with at least one silver halide emulsion layer, at least one silver halide emulsion layer being photosensitive and optionally comprising a light-screening dye, coating said at least one silver halide emulsion layer with a water-swellable intermediate layer at a ratio of 0.01 to 2.0 g/m2, said water-swellable intermediate layer comprising for at least 70% of its total weight at least one non-proteinic hydrophilic film-forming polymer and optionally comprising an antihalation dye or pigment, pressing the thus formed photosensitive layer packet with its side carrying said water-swellable intermediate layer against the hydrophilic grained and anodized surface of an aluminium foil, which has been wet with an aqueous moistening liquid that may comprise additives, removing said temporary base to leave a photosensitive monosheet layer assemblage supported by said aluminium foil and optionally drying said photosensitive monosheet layer assemblage supported by said aluminium foil, (2) photo-exposing the thus formed photosensitive monosheet layer assemblage, (3) applying an aqueous alkaline solution to the photo-exposed silver halide emulsion layer in the presence of at least one developing agent and at least one silver halide solvent, thus reducing the photo-exposed silver halide and allowing the unreduced silver halide or complexes formed thereof to diffuse from the unexposed areas of the silver halide emulsion layer to said hydrophilic grained and anodized surface to produce from the unreduced silver halide or complexes formed thereof a silver image preferably under the catalytic influence of development nuclei on said hydrophilic grained and anodized surface, (4) separating said at least one emulsion layer and said water-swellable intermediate layer from the imaged hydrophilic grained and anodized surface, said separating being accomplished e.g. by the steps of:

bringing said monosheet layer assemblage with its side showing said at least one emulsion layer during the period of time that starts with the application of said aqueous alkaline solution and ends with said formation of a silver image on said hydrophilic grained and anodized surface in contact with a receiving means, said at least one emulsion layer and said water-swellable intermediate layer being wet with said aqueous alkaline solution having an adherence to said receiving means that is stronger than that to the imaged hydrophilic grained and anodized surface and peeling off said at least one emulsion layer and said water-swellable intermediate layer adhering to said receiving means from the imaged hydrophilic grained and anodized surface, or by the steps of:

removing said monosheet layer assemblage from the alkaline solution-applying means e.g. a bath or a roller system such as a lick roller, after completion of said formation of a silver image on said hydrophilic grained and anodized surface and detaching said at least one emulsion layer and said water-swellable intermediate layer from the imaged hydrophilic grained and anodized surface with the aid of unheated water or unheated aqueous medium, said detaching being performed e.g.:

according to a preferred mode, by rinsing with a spray or jet of unheated water or unheated aqueous medium directed onto said at least one emulsion layer and said water-swellable intermediate layer, or by agitating or shaking a tray comprising said monosheet layer assemblage immersed in unheated water or unheated aqueous medium, or agitating said monosheet layer assemblage while being immersed in unheated water or unheated aqueous medium, according to another preferred mode, by pressing said monosheet layer assemblage with its side showing said at least one emulsion layer, while being moistened with unheated water or unheated aqueous medium, against a receiving sheet such as a polyethylene-coated paper sheet and peeling off said receiving sheet together with said at least one emulsion layer and said water-swellable intermediate layer, which remain strongly adhering to said receiving sheet, from said imaged aluminium foil, the mechanical effect obtained by said rinsing or agitating or pressing against a receiving sheet and peeling off, being sufficient to eliminate said at least one emulsion layer and said water-swellable intermediate layer from the imaged hydrophilic grained and anodized surface, or by the preferential steps of:

removing the monosheet layer assemblage from the alkaline solution-applying means e.g. a bath or a roller system such as a lick roller, after completion of said formation of a silver image on said hydrophilic grained and anodized surface and detaching said at least one emulsion layer and said water-swellable intermediate layer, while still being wet with alkaline solution or while being wet with unheated water or an unheated aqueous medium applied thereto subsequent to the removal of said monosheet layer assemblage from said alkaline solution, from the imaged hydrophilic grained and anodized aluminuium foil with the aid of an air current directed onto an edge of said monosheet layer assemblage, the mechanical effect obtained by said air current being sufficient to eliminate said at least one emulsion layer and said water-swellable intermediate layer from the imaged hydrophilic grained and anodized surface, (5) treating said imaged surface by rubbing it with a fixer to enhance the water-receptivity of the non-image areas and to make the image areas oleophilic ink-receptive, (6) wetting said imaged surface with an aqueous dampening liquid to wet out the non-imaged areas, (7) coating said imaged surface with an ink that wets out the imaged areas, and (8) pressing the inked surface of said resulting lithographic aluminium offset printing plate in an offset press onto a blanket that transfers the ink onto copy sheets.

An above-described embodiment of the method of the invention comprises the following consecutive steps:

making a photosensitive monosheet layer assemblage by coating a temporary base successively with at least one silver halide emulsion layer and a water-swellable intermediate layer, next pressing the thus formed photosensitive layer packet against an aluminium foil, which has been wet with an aqueous moistening liquid, to transfer said water-swellable intermediate layer and said emulsion layer onto said wet foil, removing said temporary base to leave a photosensitive monosheet layer assemblage supported by said aluminium foil, photo-exposing the thus formed photosensitive monosheet layer assemblage.

It has, however, been found that this sequence of steps may be altered in the sense that said temporary base is not removed before the photo-exposure step. Thus, according to this interesting variant said photosensitive layer packet is pressed against a wet aluminium foil to transfer said water-swellable intermediate layer and said emulsion layer onto said wet foil, the aluminium side of the resulting sandwich is dried slightly, and the photo-exposure of the sandwich is then performed through said temporary base, which for this embodiment obviously is a transparent film base. Thanks to the presence of the temporary base the silver halide emulsion layer(s) find themselves protected from mechanical deformation, especially in wet condition.

The invention also provides a photosensitive monosheet layer assemblage for making a lithographic aluminium printing plate for use according to the DTR-process, said assemblage comprising in the given sequence:

a hydrophilic grained and anodized aluminium foil, the anodization layer of which may be coloured with an antihalation dye or pigment, optionally a silver-receptive stratum containing development nuclei for precipitation of silver from diffusing water-soluble silver complexes, which stratum may comprise an antihalation dye or pigment, at least one silver halide emulsion layer, at least part of the silver halide emulsion being photosensitive and optionally comprising a light-screening dye, wherein a water-swellable intermediate layer coated at a ratio of 0.01 to 2.0 g/m2 is provided between on the one hand said silver-receptive stratum or in the absence of said silver-receptive stratum said hydrophilic grained and anodized surface and on the other hand said at least one silver halide emulsion layer, said water-swellable intermediate layer comprising for at least 70% of its total weight at least one non-proteinic hydrophilic film-forming polymer and from 0 to 30% by weight of any other hydrophilic polymer, which may be a protein, said water-swellable intermediate layer optionally comprising an antihalation dye or pigment and optionally comprising a matting agent or spacing agent.

The invention further provides a photosensitive layer packet and a separate hydrophilic grained and anodized aluminium foil, together intended for use in transferring a transferable layer sandwich of said photosensitive layer packet by separation from a temporary base onto said separate hydrophilic grained and anodized aluminium foil in wet condition to form a photosensitive monosheet layer assemblage therewith for making a lithographic aluminium printing plate for use according to the DTR-process. Said photosensitive layer packet comprises a temporary base temporarily carrying a said separable layer sandwich comprising in the given sequence at least one silver halide emulsion layer, at least part of the silver halide emulsion being photosensitive and optionally comprising a light-screening dye, and a water-swellable layer coated at a ratio of 0.01 to 2.0 g/m2, said water-swellable layer comprising for at least 70% of its total weight at least one non-proteinic hydrophilic film-forming polymer and comprising from 0 to 30% by weight of any other hydrophilic polymer, which may be a protein, said water-swellable intermediate layer optionally comprising an antihalation dye or pigment and optionally comprising a matting agent or spacing agent, and said layer sandwich being transferable onto said wet separate hydrophilic grained and anodized aluminium foil when pressed thereon.

As referred to hereinbefore the removal of the temporary base can be delayed until the photo-exposed material is to be treated with the aqueous alkaline solution.

It has been established that thanks to the presence of the thin water-swellable layer comprising for at least 70% of its total weight at least one non proteinic hydrophilic film-forming polymer as a water-swellable intermediate layer between on the one hand said silver-receptive stratum or in the absence of said silver-receptive stratum said hydrophilic grained and anodized surface and on the other hand said at least one silver halide emulsion layer, an efficient barrier is formed against the mutual above-mentioned adverse effects that a proteinic binder, usually gelatin, and aluminium exert on each other when in contact with one another. These adverse effects are eliminated in case the thin water-swellable layer essentially consists of non-proteinic hydrophilic polymer or they are reduced when the thin water-swellable layer comprises for at least 70% of its total weight at least one non-proteinic hydrophilic polymer and has a maximum content of 30% by weight of any other hydrophilic polymer, which may be a protein. By eliminating or reducing these adverse effects in this way the shelf-life of the photosensitive monosheet layer assemblage is increased considerably. It is self-evident that when the above-defined photosensitive layer packet and separate hydrophilic grained and anodized aluminium foil are used, the contact between the proteinic binder and aluminium is excluded during storage of the separate materials so that the above-mentioned adverse effects cannot occur. Thanks to the elimination or reduction of the above-mentioned adverse effects the printing plates made according to any of the embodiments of the method of the present invention yield prints having a high quality. Moreover, no ecologically harmful substances such as enzymes e.g. trypsin have to be incorporated into the finisher liquids such as e.g. the fixer, which are needed to prepare the printing plate. Furthermore, the process is convenient and economically interesting in that no hot water is needed. Since the rinsing water or aqueous medium may be in unheated condition, it does not dissolve the proteinic binder of the developed emulsion layer. In fact the emulsion layer detaches in the form of swollen flakes that can easily be filtered from the rinsing water or aqueous medium. No clogging of filters and draining pipes can be occasioned. After filtration the rinsing water or aqueous medium is clear and non-pollutant and comprises substantially no silver particles nor silver salts so that it may be discharged in the sewage. By the term "unheated" as used herein in connection with the rinsing water or aqueous medium is meant that no external heating means are applied for heating said water or aqueous medium. However, it is self-evident that the invention also encompasses the use of warm water.

The mechanical effect either obtained by said rinsing with a spray or jet directed onto said at least one emulsion layer and said water-swellable intermediate layer or obtained by said agitation or shaking or obtained by said pressure against said receiving sheet must be sufficient to detach these layers from said imaged hydrophilic grained and anodized surface.

The presence of antihalation dyes or pigments in the water-swellable intermediate layer offers the supplemental advantage that said layer loosens more easily from the imaged aluminium foil. To further improve the loosening of the water-swellable intermediate layer and to promote an effective vacuum suction of the photosensitive material in vacuum contact exposure units, said layer may also comprise matting agents or spacing agents e.g. finely divided silica particles and polymer beads as described U.S. Pat. No. 4,614,708.

According to the preferred way of separating said at least one emulsion layer and said water-swellable intermediate layer from the imaged aluminium foil by means of an airstream, the process of the present invention is even more convenient and economically interesting in that the blown off layers detach as a cohesive mass that in contrast with the other separation methods of the present invention does not need any further separation or filtration from water or aqueous medium. The loosened cohesive mass dries rapidly and recovery of silver therefrom is easy and complete.

According to this preferred way of separating, the emulsion layer and water-swellable intermediate layer, while both still being wet with said aqueous alkaline solution or while being wet with unheated water or an unheated aqueous medium applied thereto subsequent to the removal of said monosheet layer assemblage from said alkaline solution, are detached from the imaged aluminium foil by means of an airstream e.g. a jet of compressed air, preferably an airstream blown from a slot orifice e.g. an air knife or air doctor, said airstream being directed onto the lengthwise or breadthwise edge of said monosheet layer assemblage. The device capable of generating the airstream used for separating the emulsion layer and water-swellable intermediate layer from the imaged aluminium foil e.g. an air knife can be incorporated as a separate station in the processing apparatus. In that case the latter processing apparatus includes a station for applying aqueous alkaline solution to the photo-exposed emulsion layer and allowing unreduced silver halide or complexes formed thereof to diffuse to the aluminium foil and a said station for separating by means of an airstream. As mentioned before unheated water or an unheated aqueous medium may be applied optionally to the monosheet layer assemblage after removal thereof from said alkaline solution and prior to said detaching by means of an airstream. It is self-evident that the invention also encompasses the use of hot water.

According to the variant using said receiving sheet, the receiving sheet together with said at least one emulsion layer and said water-swellable intermediate layer, which remain strongly adhering to said receiving sheet, are peeled off from said imaged aluminium foil.

The restricted softening and swelling in alkaline activating or developing solutions is due to ions such as e.g. sulphite and thiosulphate ions, which are present conventionally therein. This restricted swelling is comparable to that observed for emulsion gel layers. The typical changes in the degree of swell of an emulsion gel layer as it passes through the development in an alkaline solution causing a limited swell and subsequently through the rinsing with a water bath causing high swell have been shown in FIG. 15.17 on page 453 of "The Theory of the Photographic Process" 4th edition, edited by T. H. James, MacMillan Publishing Co., Inc. New York.

The aqueous moistening liquid used to wet said aluminium foil so that the transferable layers can be transferred thereto may consist of water or may be an aqueous solution comprising additives such as i.a. surface-active agents, a water-miscible alcohol e.g. ethanol, and hardeners including latent hardeners.

The non-proteinic hydrophilic film-forming polymer has to be chosen from the group of film-forming polymers that are soluble in aqueous medium and thus soften and swell by absorption of water. Suitable polymers are e.g. polyvinyl alcohol, polyvinyl pyrrolidone, polyethylene oxide, partly hydrolyzed polyvinyl acetate, sulphonated polystyrene, hydroxyethyl cellulose, carboxymethyl cellulose, cellulose acetate hydrogen phthalate, dextran, dextrins or derivatives thereof, starch, gum arabic, and alginic acid derivatives such as salts or esters thereof. It is also possible to use mixtures of two or more different non-proteinic hydrophilic film-forming polymers. Preference is given, however, to at least one polyvinyl alcohol having a molecular weight not higher than 15,000. The ratio of alcohol and acetate units in the polyvinyl alcohol does not seem to play an important role.

On the one hand the non-proteinic hydrophilic film-forming polymer or mixture of non-proteinic hydrophilic polymers is chosen such that when a layer thereof—even a layer thereof comprising up to 30% by weight of any other hydrophilic polymer, which may be protein, is immersed in said aqueous alkaline solution, whether it is an activating solution or a developing solution, softening and swelling of said polymer(s) is restricted substantially to an extent that the layer containing them remains adhering to the aluminium foil. On the other hand the non-proteinic hydrophilic film-forming polymer or mixture of non-proteinic hydrophilic polymers is chosen such that when:

either a spray or jet of water or of an aqueous non-alkaline medium is directed onto said at least one emulsion layer and said water-swellable intermediate layer, or a tray comprising said monosheet layer assemblage immersed in unheated water or unheated aqueous medium is agitated or shaken, or said monosheet layer assemblage is agitated while being immersed in unheated water or unheated aqueous medium, or said monosheet layer assemblage is pressed with its side showing said at least one emulsion layer, while being moistened with unheated water or unheated aqueous medium, against a receiving sheet such as e.g. a subbed cellulose triacetate film sheet, the water-swellable intermediate layer absorbs water and as a consequence thereof softens and swells to such an extent that it is caused to detach from the aluminium foil and carry along the also swollen emulsion layer(s).

For use according to the preferred method of separating the emulsion layer(s) and intermediate layer from the aluminium foil by means of an airstream, the non-proteinic hydrophilic film-forming polymer or mixture of non-proteinic hydrophilic polymers is chosen such that when a layer thereof—even a layer thereof comprising up to 30% by weight of any other hydrophilic polymer, which may be protein, is immersed in said aqueous alkaline solution, whether it is an activating solution or a developing solution, or is immersed, after having been removed from said aqueous alkaline solution, in unheated water or in an unheated aqueous medium, softening and swelling of said polymer(s) is restricted substantially to an extent that the layer containing said polymer(s) remains adhering to the aluminium foil. On the other hand the nature of the non-proteinic hydrophilic film-forming polymer or mixture of non-proteinic hydrophilic polymers should be such that when an airstream is directed onto an edge of said monosheet layer assemblage, said layers both still being wet with absorbed aqueous alkaline solution or with subsequently applied unheated water or unheated aqueous medium, the swollen intermediate layer detaches readily from said aluminium foil while carrying along the also swollen emulsion layer(s).

The water-swellable intermediate layer is coated at a ratio of 0.01 to 2.0 g/m2. The coating weight of the composition for making the water-swellable intermediate layer is preferably not lower than 0.01 g/m2, since otherwise an inadequate or insufficient barrier against the above-mentioned adverse effects may be created. On the other hand the coating weight of the composition for making the water-swellable intermediate layer must not be higher than 2.0 g/m2, since owing to the increased thickness of the layer the diffusion path of the migrating silver complexes would be extended such that the chances of lateral diffusion of these migrating silver complexes would increase. Lateral diffusion may, of course, lead to insufficient sharpness of the silver image formed on the aluminium foil.

The water-swellable intermediate layer comprising at least one non-proteinic hydrophilic film-forming polymer may incorporate at least one dye or pigment for antihalation purposes. The usual dyes and pigments can be chosen depending upon the desired absorption spectrum of the resulting layer relative to the spectral sensitivity of the silver halide emulsion layer(s).

The water-swellable intermediate layer comprising at least one non-proteinic hydrophilic film-forming polymer may in addition to dyes or pigments and matting agents or spacing agents comprise further ingredients such as i.a. developing agents, other development ingredients, base precursors, silver halide solvents, and anti-corrosive agents.

The aluminium foil of the photosensitive monosheet layer assemblage of the present invention can be made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminium surface can be carried out mechanically or electrolytically in any known way. The roughness produced by the graining is measured as a centre line average value expressed in um and preferably varies from about 0.2 to about 1.5 $\mu$m.

The anodization of the aluminium foil can be performed in electrolytes such as e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.00 $\mu$m. To promote the image sharpness and, as a consequence thereof, the sharpness of the final printed copy, the anodization layer may be coloured in the mass with an antihalation dye or pigment e.g. as described in JA-A 58-14797. The dye or pigment or a combination of dyes or pigments used for such colouring in the mass are chosen such that they prevent or reduce halation in silver halide emulsions having any desired photosensitivity range comprised between 300 and 900 nm.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. The anodic surface of the aluminium foil can thus be rinsed with water at 70°-100° C. or with steam. The hot sealing water may comprise additives such as nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U.S. Pat. No. 3,861,917 and in the documents referred to therein.

To promote the image sharpness and, as a consequence thereof, the sharpness of the final printed copy, the grained, anodized, and optionally sealed aluminium foil can be provided with a very thin antihalation coating of a dye or pigment. As already mentioned before, the usual dyes and pigments can be chosen such that they prevent or reduce halation in the silver halide emulsions used, which have any desired photosensitivity range comprised between 300 and 900 nm.

According to one embodiment the aluminium foil constitutes the sole receptor material for the silver image in that the aluminium itself takes part actively in the formation of the silver image by electrochemically reducing the transferred silver complexes. The use of such an aluminium foil as sole receptor material has been described in i.a. EP-A 0059008.

According to a frequently used alternative embodiment the grained, anodized, and optionally sealed aluminium foil can be provided with a silver-receptive stratum comprising development nuclei that initiate the physical development of the transferred silver complexes to form a silver image therein. Suitable development nuclei are sulphides of heavy metals e.g. sulphides of antimony, bismuth, cadmium, cobalt, lead, nickel, palladium, platinum, silver, and zinc. Especially suitable development nuclei are NiS.Ag$_2$S nuclei as described in U.S. Pat. No. 4,563,410. Other suitable development nuclei are salts such as e.g. selenides, polyselenides, polysulphides, mercaptans, and tin (II) halides. Heavy metals or salts thereof and fogged silver halide are suitable as well. The complex salts of lead and zinc sulphides are active both alone and when mixed with thioacetamide, dithiobiuret, and dithiooxamide. Heavy metals, preferably silver, gold, platinum, palladium, and mercury can be used in colloidal form.

The silver-receptive stratum may incorporate at least one antihalation dye or pigment to promote the image sharpness. Again, the usual dyes and pigments can be chosen depending upon the desired absorption spectrum of the silver-receptive stratum relative to the spectral sensitivity of the silver halide emulsion layer(s) used.

The silver halide emulsion layer can be any photosensitive silver halide emulsion comprising a hydrophilic colloid binder. The photosensitive silver halide used in the present invention may comprise silver chloride, silver bromide, silver bromoiodide, silver chlorobromoiodide and the like, or mixtures thereof. To obtain a sufficiently high rate of dissolution of the silver halide and a satisfactory gradation necessary for graphic purposes a silver halide emulsion mainly comprising silver chloride is often used. This silver chloride emulsion may comprise minor amounts of silver bromide and/or silver iodide.

The silver halide emulsions may be coarse- or fine-grained and can be prepared by any of the well known procedures e.g. single jet emulsions, double jet emulsions such as Lippmann emulsions, ammoniacal emulsions, thiocyanate- or thioether-ripened emulsions such as those described in U.S. Pat. Nos. 2,222,264, 3,320,069, and 3,271,157. Surface image emulsions may be used or internal image emulsions may be used such as those described in U.S. Pat. Nos. 2,592,250, 3,206,313, and 3,447,927. If desired, mixtures of surface and internal image emulsions may be used as described in U.S. Pat. No. 2,996,382. The silver halide particles of the photographic emulsions may have a regular crystalline form such as a cubic or octahedral form or they may have a transition form. Regular-grain emulsions are described in e.g. J. Photogr. Sci., Vol. 12, No. 5, September/October 1964, pp. 242-251. The silver halide grains may also have an almost spherical form or they may have a tabular form (so-called T-grains), or may have composite crystal forms comprising a mixture of regular and irregular crystalline forms. The silver halide grains may have a multilayered structure having a core and shell of different halide composition. Besides having a differently composed core and shell the silver halide grains may comprise also different halide compositions and metal dopants inbetween.

Two or more types of silver halide emulsions that have been prepared differently can be mixed for forming a photographic emulsion for use in a photographic material treated with a processing liquid according to the present invention.

The average size of the silver halide grains may range from 0.2 to 1.2 $\mu$m, and the size distribution can be homodisperse or heterodisperse. A homodisperse size distribution is obtained when 95% of the grains have a size that does not deviate more than 30% from the average grain size.

In addition to silver halide the emulsions may also comprise organic silver salts such as e.g. silver benzotriazolate and silver behenate.

The silver halide crystals can be doped with $Rh^{3+}$, $Ir^{4+}$, $Cd^{2+}$, $Zn^{2+}$, $Pb^{2+}$.

The photographic emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The emulsion can be desalted in the usual ways e.g. by dialysis, by flocculation and re-dispersing, or by ultrafiltration.

Besides the silver halide another essential component of a photosensitive emulsion layer is the binder. The binder is a hydrophilic colloid, usually a protein, preferably gelatin. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

Apart from negative-working silver halide emulsions that are preferred for their high photosensitivity, use can be made also of direct-positive silver halide emulsions that produce a positive silver image in the emulsion layer(s) and a negative image on the aluminium foil.

For instance, direct-positive emulsions of the type described in U.S. Pat. No. 3,062,651 may be employed. In direct-positive emulsions a non-hardening fogging agent such as stannous chloride and formamidine sulphinic acid can be used.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A 493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions can also be sensitized with polyalkylene oxide derivatives, e.g. with polyethylene oxide having a molecular weight of 1000 to 20,000, or with condensation products of alkylene oxides and aliphatic alcohols, glycols, cyclic dehydration products of hexitols, alkyl-substituted phenols, aliphatic carboxylic acids, aliphatic amines, aliphatic diamines and amides. The condensation products have a molecular weight of at least 700, preferably of more than 1250. It is also possible to combine these sensitizers with each other as described in BE-A 537,278 and GB-A 727,982.

The spectral photosensitivity of the silver halide can be adjusted by proper sensitization to any desired spectral range comprised between 300 and 900 nm by means of the usual mono- or polymethine dyes such as acidic or basic cyanines, hemicyanines, oxonols, hemioxonols, styryl dyes or others, also tri- or polynuclear methine dyes e.g. rhodacyanines or neocyanines. Such spectral sensitizers have been described by e.g. F. M. Hamer in "The Cyanine Dyes and Related Compounds" (1964) Interscience Publishers, John Wiley & Sons, New York. The spectral photosensitivity of the silver halide can also be adjusted for exposure by laser light e.g. heliumneon laser light, argon laser light, and solid state laser light. Dyes that can be used for adjusting the photosensitivity to laser light have been described in i.a. JA-A 62284344, 62284345, 62141561, 62103649, 62139555, 62105147, 62105148, 62075638, 62062353, 62062354, 62062355, 62157027, 62157028, 62113148, 61203446, 62003250, 60061752, 55070834, 51115821, 51115822, 51106422, 51106423, 51106425; DE-A 3,826,700; U.S. Pat. No. 4,501,811, 4,725,532, 4,784,933; GB-A 1,467,638; and EP-A 100,654 and in documents cited therein.

The silver halide can also be sensitized with a dye or a mixture of dyes providing a spectral sensitivity mainly in the range of 400 to 500 nm and not extending the sensitivity substantially beyond 500 nm so that the sensitivity at 530 nm is at least $10^2$ lower than that at 500 nm and that the resulting photosensitive monosheet layer assemblage can be handled in yellow safe-light conditions prior to the photo-exposure, said conditions corresponding to the light transmitted by a cut-off filter having at 500 nm a density of at least 2.5, at 530 nm a density not higher than 2.0, at 540 nm a density not higher than 1.0, at 550 nm a density not higher than 0.4, at 560 nm a density not higher than 0.2, and beyond 580 nm a density not higher than 0.1. Suitable dyes that can be used for that purpose have been described in e.g. U.S. Pat. No. 4,686,170. Image-wise exposure of silver halide emulsions sensitized in this way can be performed by means of lasers emitting below 500 nm e.g. an argon laser emitting at 488 nm. A particular advantage in the case of image-wise exposure of direct-positive silver halide emulsions sensitized with such dyes and used for the production of printing plates according to the DTR-process in general is that an economical and quick exposure by laser under yellow safelight conditions is possible, since only the areas of the direct-positive silver halide emulsions that correspond with the finally obtained printing areas on the printing plate have to be exposed and not the background areas.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by Birr in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole.

The silver halide emulsions may comprise other ingredients e.g. antifogging agents, developers and/or development accelerators, wetting agents, and hardeners. Optionally, the silver halide emulsions may comprise matting agents or spacing agents e.g. finely divided silica particles and polymer beads as described U.S. Pat. No. 4,614,708, to promote an effective vacuum suction of the photosensitive material in vacuum contact exposure units.

Whereas according to known methods in the art it is indeed customary to substantially harden the silver halide emulsions, the binder of which usually is gelatin, to prevent an undesired transfer of gelatin to the aluminium foil, hardening is not necessary according to the present invention. The transfer of gelatin to the aluminium foil indeed gives rise to the above described disadvantages. The water-swellable intermediate layer actually prevents the binder of the silver halide emulsion or emulsions from being transferred to the aluminium foil or substantially reduces such transfer. The hardening degree of the silver halide emulsion layer can thus be adjusted at wish.

The silver halide emulsion may comprise light-screening dyes that absorb scattering light and thus promote the image sharpness and, as a consequence thereof, the sharpness of the final printed copy.

Light-absorbing dyes that can be used as light-screening dyes have been described in i.a. U.S. Pat. Nos. 4,092,168, 4,311,787, DE-A 2,453,217, and GB-A 7,907,440. Alternatively, light-absorbing dyes can be incorporated into a thin supplemental intermediate layer provided between said at least one silver halide emulsion layer and said water-swellable layer comprising a non-proteinic hydrophilic film-forming polymer. Again, the light-screening dyes or light-absorbing dyes can be chosen depending upon the desired absorption spectrum of the layer comprising them.

More details about the composition, preparation and coating of silver halide emulsions can be found in e.g. Product Licensing Index, Vol. 92, December 1971, publication 9232, p. 107–109.

As an interesting variant the silver halide emulsion may consist of a first photosensitive silver halide emulsion in which a normal latent image is formed upon image-wise exposure and a second low-speed silver halide emulsion whose speed is so low that no or almost no latent image is formed therein. When the low-speed silver halide emulsion and the photosensitive silver halide emulsion are coated to form different layers, the resulting emulsion layers are arranged in such a way that the low-speed emulsion is remotest from the aluminium foil. It is also possible to coat one single layer comprising a mixture of said photosensitive silver halide emulsion and said low-speed silver halide emulsion.

Thanks to the combination of photosensitive and low-speed emulsions a higher amount of silver can migrate to form the silver image on the aluminium foil. As a result, an enhanced contrast and a high resistance against mechanical wear are obtained. It has indeed been established that upon application of an aqueous alkaline solution to the image-wise exposed photosensitive silver halide emulsion in the presence of a developing agent and a silver halide solvent a silver image is formed therein and that the unreduced silver halide or complexes formed thereof diffuse from the unexposed areas to said hydrophilic grained and anodized aluminium foil and that additionally silver halide or complexes formed thereof diffuse from the low-speed emulsion through the unexposed areas of the photosensitive silver halide emulsion also to the aluminium foil, the reduced silver of the photosensitive emulsion forming a barrier for silver halide or complexes of the low-speed emulsion that would also tend to migrate towards the aluminium foil. As a result, the silver halide or complexes thereof diffusing from both the photosensitive emulsion and the low-speed emulsion together build up said strengthened high-contrast silver halide on the aluminium foil.

The low-speed silver halide emulsion is a silver chloride-containing emulsion, the speed of which is so low, that no visible image is formed therein under the conditions of exposure and development of the photosensitive silver halide emulsion layer. Inasmuch as the sensitivity of the silver chloride-containing emulsion must be low, no second ripening or after-ripening thereof is needed. The low-speed silver chloride-containing emulsion, which is rinsed to be free of excess salts, preferably is a fine-grain silver chloride-containing emulsion having a particle size in the range of 50 to 500 nm.

The low-speed emulsion may be a pure silver chloride emulsion or an emulsion of mixed silver halides comprising silver chloride e.g. a silver chlorobromide or chlorobromoiodide emulsion. However, the low-speed emulsion preferably is a silver chloride emulsion for the greater part.

In case a mixture of low-speed emulsion and of imaging emulsion is coated to form one single layer, the amount of low-speed emulsion may vary within wide limits. Favourable results can be obtained when the ratio of low-speed silver chloride-containing emulsion to image-forming emulsion, expressed in parts by weight of silver nitrate, ranges from 10:1 to 1:1. The amount of low-speed emulsion to be added depends i.a. on its own nature, on the type of image-forming emulsion used, and on the effect desired. It can be determined easily by routineers in the art by making a few comparative tests.

When separate layers of low-speed emulsion and of imaging emulsion are used, the ratio expressed in parts by weight of silver nitrate of said different layers, also ranges from 10:1 to 1:1.

The optional supplemental intermediate layer, which may be present between said at least one silver halide emulsion layer and said water-swellable layer comprising a non-proteinic hydrophilic film-forming polymer, may comprise one or more ingredients such as i.a. antihalation dyes or pigment, developing agents, silver halide solvents, base precursors, and anticorrosion substances.

With respect to the above-mentioned embodiment of the present invention, according to which a temporary base is coated first with at least one silver halide emulsion layer and next with said water-swellable layer comprising at least one non-proteinic hydrophilic film-forming polymer and according to which the resulting photosensitive layer packet comprising said water-swellable layer comprising at least one non-proteinic hydrophilic film-forming polymer and said at least one silver halide emulsion layer is transferred onto the wet hydrophilic grained and anodized surface of an aluminium foil, the following particulars can be given.

The adherence of said at least one silver halide emulsion layer to said temporary base should be such that an easy stripping off from the temporary base is possible after pressing said photosensitive layer packet against said wet hydrophilic grained and anodized aluminium foil. Therefore, a relatively hydrophobic temporary base is used, which preferably is flexible and is made of i.a. cellulose triacetate, polystyrene, polyester, and copoly(vinyl acetate/vinyl chloride). Preferably, the temporary base is an unsubbed cellulose triacetate film base. The thickness of the cellulose triacetate film base may vary between wide limits, but preferably is approximately 100 $\mu$m.

The said at least one silver halide emulsion layer can be composed in such a way that its adherence to the temporary base in wet state is less than that in dry state. Optionally, hygroscopic substances e.g. water-soluble organic hygroscopic compounds such as glycerol, or wetting and/or plasticizing agents can be added to said at least one silver halide emulsion layer to adjust its adherence.

Other temporary bases having a repelling power for wet gelatin coatings are e.g. a paper base coated with a polyethylene layer, a paper base impregnated with wax, a paper base coated with a layer of cellulose nitrate, a paper base coated with a layer of insolubilized polyvinyl alcohol, and a layer of alginic acid insolubilized with an alkaline earth metal salt. Temporary bases comprising a paper support should be removed before the photo-exposure, whereas transparent film bases may remain during the photo-exposure and are in that case removed afterwards.

The transfer of the transferable layers onto the aluminium foil can be carried out in an apparatus, in which the aluminium foil is moistened and the wet aluminium foil and the photosensitive layer packet are pressed together between rollers. An apparatus particularly suitable for use in transferring transferable layers from the temporary base to the wet aluminium foil has been described in U.S. Pat. No. 4,701,401. Suitable apparatus for that purpose are the AGFAPROOF TR unit and the AGFAPROOF TR S unit, both marketed by AGFA-GEVAERT, Belgium.

A wide choice of cameras for exposing the photosensitive silver halide emulsion exists on the market. Horizontal, vertical and darkroom type cameras and contact-exposure apparatus are available to suit any particular class of reprographic work. The photosensitive silver halide emulsion(s) used in the layer assemblages according to the present invention can also be exposed with the aid of i.a. laser recorders and cathode rays tubes.

The development and diffusion transfer are effected with the aid of an aqueous alkaline solution in the presence of at least one developing agent and at least one silver halide solvent. The developing agent(s) and/or the silver halide solvent(s) can be incorporated in the aqueous alkaline solution and/or in said at least one silver halide emulsion layer and/or in said water-swellable layer comprising at least one non-proteinic hydrophilic film-forming polymer and/or in a supplemental hydrophilic colloid layer in water-permeable relationship with said at least one silver halide emulsion layer. The latter supplemental hydrophilic colloid layer can be coated on top of said at least one silver halide emulsion layer remotest from said aluminium foil e.g. it can be provided between said temporary base and said at least one silver halide emulsion layer.

The silver halide solvent can also be incorporated at least in part in the silver-receptive stratum coated on the aluminium foil. When the aqueous alkaline solution does not comprise the developing agent(s), it is merely an activating liquid that is capable of dissolving the developing agent(s) contained in one of the layers.

The conventional developing agents for DTR-processing are a hydroquinone-type compound in combination with a secondary developing agent of the class of 1-phenyl-3-pyrazolidinone compounds and p-N-methyl-aminophenol. Particularly useful 1-phenyl-3-pyrazolidinone developing agents are 1-phenyl-3-pyrazolidinone, 1-phenyl-4-methyl-3-pyrazolidinone, 1-phenyl-4-ethyl-5-methyl-3-pyrazolidinone, and 1-phenyl-4,4-dimethyl-3-pyrazolidinone.

The hydroquinone-type compound is e.g. hydroquinone, methyl-hydroquinone, or chlorohydroquinone.

The silver halide solvent, which acts as a complexing agent for silver halide, preferably is a water-soluble thiosulphate or thiocyanate e.g. sodium, potassium, or ammonium thiosulphate and sodium, potassium or ammonium thiocyanate.

Other suitable silver halide solvents are i.a. sulphites, amines, and such alkanolamines like e.g. ethanolamine, diethanolamine, triethanolamine, diisopropanolamine, 2-methyl-aminoethanol, 2-ethyl-aminoethanol, 2-dimethylaminoethanol, 2-diethyl-aminoethanol, 2-methyl-2-amino-1-propanol, 1-diethylamino-2-propanol, 3-diethylamino-1-propanol, isopropylaminoethanol, 3-amino-1-propanol, 2-methyl-2-amino-1,3-propanediol, benzyldiethanolamine, and 2-(hydroxymethyl)-2-amino-1,3-propanediol.

Further suitable silver halide solvents are those disclosed in "The Theory of the Photographic Process" 4th Ed., edited by T. H. James, pages 474–475. Further interesting silver halide solvents have been described in i.a. U.S. Pat. Nos. 2,857,276 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is even possible to incorporate at least one silver halide solvent into a suitable layer and add at least one other silver halide solvent to the developing solution.

The following quantitative ranges given for the developing agents, silver halide solvents, and sulphite apply to the amount of these compounds present as solutes in the aqueous alkaline solution during the DTR-processing, whether these compounds make part of the aqueous alkaline solution, which in that particular case actually is an aqueous alkaline developing solution, or were dissolved from the layers containing them upon application thereto of the aqueous alkaline solution, in which case it is an activating solution.

A suitable quantitative combination of hydroquinone and at least one secondary developing agent of the class of 1-phenyl-3-pyrazolidinones and p-N-methyl-amino-phenol comprises hydroquinone in an amount not lower than 0.078 mole per liter of aqueous alkaline solution and the secondary developing agent(s) in an amount not lower than 0.0080 mole per liter, the molar ratio of hydroquinone to said secondary developing agent(s) not being lower than 9.7. Preferred amounts of hydroquinone are in the range of 0.05 mole to 0.25 mole per liter and preferred amounts of secondary developing agent(s) in the range of $1.8 \times 10^{-3}$ to $2.0 \times 10^{-2}$ mole per liter.

The aqueous alkaline solution may comprise sulphite e.g. sodium sulphite in an amount ranging from 40 g to 180 g per liter, preferably from 60 to 160 g per liter, and thiosulphate and/or thiocyanate in an amount ranging from 5 g to 20 g per liter.

The pH of the aqueous alkaline solution preferably is at least 12, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The aqueous alkaline solution may comprise such alkali-providing substances like hydroxides of sodium and potassium, alkali metal salts of phosphoric acid and/or silicic acid e.g. trisodium phosphate, orthosilicates, metasilicates, hydrodisilicates of sodium or potassium, and sodium carbonate. The alkali-providing substances can be substituted in part or wholly by alkanolamines.

The aqueous alkaline solution may comprise at least one alkanolamine to improve its life-time and performance for the DTR-process. Suitable alkanolamines are i.a. N,N,N-triethanolamine, 2-amino-2-hydroxymethyl-propan-1,3-diol, N-methyl-diethanolamine, N-ethyl-diethanolamine, diisopropanolamine, N,N-diethanolamine, 3,3'-amino-dipropanol, 2-amino-2-methyl-propan-1,3-diol, N-propyl-diethanolamine, N-butyl-diethanolamine, N,N-dimethyl-ethanolamine, N,N-diethyl-ethanolamine, N,N-diethyl-isopropanolamine, 1-amino-propan-2-ol, N-ethanolamine, N-methyl-ethanolamine, N-ethyl-ethanolamine, 3-amino-propanol, 4-amino-butanol, and 5-amino-pentan-1-ol.

According to a preferred embodiment described in Research Disclosure 27939 (July 1987) pages 450–451 the aqueous alkaline solution comprises at least one tertiary alkanolamine having a pKa value higher than 8.5. More preferably, the solution comprises two or more tertiary alkanolamines having a pKa value higher than 9.0.

The aqueous alkaline solution may further comprise silver-image hydrophobizing compounds e.g. hetercyclic mercapto compounds. The addition of heterocyclic mercapto compounds more particularly a mercapto-1,3,4-thiadiazole to a developing liquid for the purpose of hydrophobizing the silver image formed according to the DTR-process on an aluminium foil has been described already in DE-A 1,228,927. Other suitable mercapto-thiadiazoles that can be added to the aqueous alkaline solution have been disclosed in U.S. Pat. No. 4,563,410. Another suitable hydrophobizing compound is 2-mercapto-5-heptyl-oxa-3,4-diazole.

These hydrophobizing compounds can be added to the aqueous alkaline solution in an amount of preferably 0.1 to 3 g per liter and preferably in admixture with 1-phenyl-5-mercaptotetrazole, the latter compound being used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Buffered stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus such as the CR 430, CR 740, or CR 1100-Processors marketed by AGFA-GEVAERT, Belgium. They are normally carried out at a temperature in the range of 18° C. to 30° C.

After formation of the silver image on the aluminium foil the excess of alkaline solution still present on the foil is eliminated, preferably by guiding the foil through a pair of squeezing rollers.

According to a preferred embodiment of uncovering the imaged aluminium foil the intermediate layer and the emulsion layer(s) swollen with alkaline solution or with unheated water or unheated aqueous medium applied subsequent to the removal from said alkaline solution are separated from the imaged aluminium foil by an airstream directed on an edge of said monosheet layer assemblage.

According to another embodiment of uncovering the imaged aluminium foil the developed monosheet layer assemblage is rinsed with unheated water or an unheated aqueous medium so that the water-swellable intermediate layer and the emulsion layer(s) are removed from the imaged aluminium foil.

According to another embodiment of uncovering the imaged aluminium foil the water-swellable intermediate layer and the emulsion layer(s) can be removed also by slightly agitating the developed monosheet layer assemblage while being dipped in unheated water or unheated aqueous medium or by slightly agitating a tray comprising unheated water or unheated aqueous medium in which said developed monosheet layer assemblage has been immersed. According to a convenient method of rinsing away said layers, the developed monosheet layer assemblage is held under a spray or jet of unheated water or unheated aqueous medium. The mechanical pressure of a water jet or spray directed onto these layers suffices to detach them from the aluminium foil. The unheated aqueous medium used to detach the water-swellable intermediate layer and the emulsion layer(s) by rinsing may comprise ingredients such as i.a. weak acidifying agents, wetting agents, and hardeners including latent hardeners.

According to a further embodiment of uncovering the imaged aluminium foil the monosheet layer assemblage is pressed with its side showing the emulsion layer(s) while being moistened with unheated water or with unheated aqueous medium against a receiving sheet such as e.g. a paper or film base coated with a hardened gelatin layer comprising a matting agent or against a porous web as described in Research Disclosure 23017 (June 1983) pages 223–4 and said imaged aluminium foil is peeled off from the emulsion layer(s) and the water-swellable intermediate layer, which are supported by the receiving sheet and strongly adhere thereto. According to an alternative embodiment the emulsion layer(s) and the water-swellable intermediate layer can also be removed by scraping off or by wiping off e.g. with a sponge.

According to an alternative method of separating said at least one silver halide emulsion layer and said water-swellable intermediate layer from the imaged hydrophilic grained and anodized surface, the monosheet layer assemblage is placed with its side showing said at least one silver halide emulsion layer during the period of time that starts with the application of said aqueous alkaline solution and ends with said formation of a silver image on said hydrophilic grained and anodized surface in contact with a receiving means, said at least one silver halide emulsion layer and said water-swellable intermediate layer after said formation of a silver image while still being wet with said aqueous alkaline solution, having an adherence to said receiving means that is stronger than that to the imaged hydrophilic grained and anodized surface. Next, said at least one silver halide emulsion layer and said water-swellable intermediate layer adhering to and supported by said receiving means are peeled off from the imaged hydrophilic grained and anodized surface. According to this method the emulsion layer(s) and water-swellable intermediate layer are separated from the imaged hydrophilic grained and anodized surface after the silver image has been formed thereon and while they are still wet with said aqueous alkaline solution. For carrying out this process the photo-exposed monosheet layer assemblage and a receiving means e.g. a paper or film base coated with a hardened gelatin layer comprising a matting agent can be introduced in a processing device through different inlet openings and after completion of the development and of the image transfer pressed together in the nip of two rollers. When the contacting monosheet layer assemblage and the receiving means leave the nip between the two rollers, a suitable and appropriately mounted separating blade can separate the imaged aluminium foil from the receiving means, to which said water-swellable intermediate layer and said emulsion layer(s) remain adhering. As a consequence the thus obtained bared aluminium foil carrying the transferred silver image does not need any further rinsing, although rinsing with water is possible, of course, if desired.

It is common practice in the art to subject the imaged surface of the aluminium foil to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the aluminium. In U.S. Pat. No. 4,563,410 an interesting method for hydrophobizing the silver image has been described.

Suitable ingredients for the fixer are e.g. organic compounds containing a mercapto group such as dodecylmercaptans, benzothiazole-2-thiol, 1,3,4-thiadiazole-2-thiol, 1-phenyl-1-H-tetrazole-5-thiol, triazinethiols e.g. 1-octyl-1,2,4,5-tetrahydro-S-triazine-5-thiol, and compounds containing a thioacid or a thioamide group. Additives improving the oleophilic ink-repellency of the bare anodized aluminium foil areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, and polyvinyl alcohol. Optionally, hygroscopic substances e.g. sorbitol, glycerol, tri(hydroxyethyl)ester of glycerol, and turkey red oil may be added. Furthermore, phosphoric acid and cationic surface-active compounds such as hexadecyl trimethyl ammonium bromide can also be added to the fixer. A suitable fixer is e.g. a composition comprising a solution of 1-octyl-1,2,4,5-tetrahydro-S-triazine-5-thiol in acetone or a suspension thereof in a solution of gum arabic. Other suitable fixers have been described in i.a. U.S. Pat. No. 4,062,682 and U.S. Pat. No. 4,563,410.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid. Suitable devices for automatic treatment with a fixer are the CRF 45 and CRF 85 fixing units, both marketed by AGFA-GEVAERT, Belgium.

As soon as the aluminium foil carrying the silver image has been treated with the fixer, it is ready to be inked and used as a printing plate so that a treatment thereof with a lacquer composition for strengthening the printing areas is not necessary. The printing plate has to be wet at the stage the greasy printing ink is applied. This is a generally known fact in the art and it is usual to apply an aqueous liquid before the printing ink is applied. This can be done by means of a wet sponge or by means of the fountain arrangements (dampening system) of the printing machine.

For the production of long-run printing plates requiring more than 100,000 prints a second after-treatment consisting in applying a lacquer onto the silver image areas may be advisable. For this purpose, lacquers based on phenol- or cresol-formaldehyde alkyd resins and/or epoxyresins are commonly used.

Another useful resin for such a lacquer is a mixture of homopolymers and copolymers of styrene, ortho-, meta-, or para-vinyltoluene and indene units. Cyclohexanone can be used as solvent and linseed oil as plasticizer. Examples of suitable lacquer compositions have been described in i.a. GB-A 968,706 and 1,071,163 and in CA-A 686,284.

A lithographic composition in which the fixer and lacquer are combined to one composition has been described in e.g. GB-A 969,072.

The following examples illustrate the present invention.

EXAMPLE 1

Three identical photosensitive monosheet layer assemblages were made as follows.

An aluminium foil having a thickness of 0.20 mm was grained, anodized, and sealed according to the method described in Example 1 of U.S. Pat. No. 3,861,917. The centre line average value obtained by the graining was 0.5 $\mu$m. The anodization layer having a weight of 2.7 g per m$^2$ was coated with a silver-receptive stratum from a silver sol in water comprising no binder, prepared according to the Carey Lea method, the resulting stratum having a weight in dried condition of 4 mg of silver per m2.

The silver-receptive stratum was covered with a substantially unhardened photosensitive negative-working cadmium-free gelatin silver chlorobromoiodide emulsion layer (97.98/2/0.02 mol %), the silver halide being coated in an amount corresponding to 2.40 g of silver nitrate per m2 and the gelatin content of the resulting photosensitive emulsion layer being 1.58 g/m2.

The resulting 3 identical photosensitive monosheet layer assemblages are called "Comparison A", "Comparison B", and "Comparison C" respectively hereinafter.

A photosensitive monosheet layer assemblage called "Invention" was then made in the same way as described for Comparison A, B, and C, with the only difference that a water-swellable intermediate layer comprising polyvinyl alcohol as non-proteinic hydrophilic film-forming polymer was provided between the silver-receptive stratum and the photosensitive emulsion layer. The water-swellable intermediate layer was coated on the dry silver-receptive stratum from an aqeuous composition in such a way that the resulting dried layer had a weight of 0.33 g of polyvinyl alcohol per m2, said composition comprising:

| | |
|---|---|
| 5% aqueous solution of polyvinyl alcohol having a molecular weight of 10,000 and comprising 95 mol % of vinyl alcohol units and 5 mol % of vinyl acetate units Helioechtpapierrot BL (trade mark for a dye sold by BAYER AG, D-5090 Leverkusen, West-Germany) | 100 ml |
| | 15 g |
| saponine | 2.5 g |
| sodium oleylmethyltauride | 1.25 g |
| demineralized water | 205 ml |
| (pH-value: 5.6) | |

The 4 photosensitive monosheet layer assemblages were exposed identically through a contact screen in a process-camera and immersed for 8 s at 25° C. in a freshly made developing solution having the following ingredients in a CR 430 processor marketed by AGFA-GEVAERT, Belgium:

| | |
|---|---|
| carboxymethylcellulose | 18 g |
| sodium hydroxide | 22.5 g |
| anhydrous sodium sulphite | 120 g |
| hydroquinone | 20 g |
| 1-phenyl-3-pyrazolidinone | 3 g |
| potassium bromide | 0.75 g |
| anhydrous sodium thiosulphate | 7.5 g |
| ethylene diamine tetraacetic acid tetrasodium salt | 2 g |
| demineralized water to make | 1000 ml |
| pH (25° C.) = 13 | |

The initiated diffusion transfer was allowed to continue for 30 s to form a silver image on the aluminium foil.

To remove the developed silver halide emulsion layer and the swollen intermediate layer (Invention) from the imaged aluminium foil, each of the 4 developed monosheet layer assemblages was rinsed for 30 s with a water jet. In case the emulsion layer did not detach with unheated water the test was repeated with a fresh identical layer assemblage and the temperature of the rinsing water was enhanced. The temperature used for each of the 4 monosheet layer assemblages is specified in Table 1 hereinafter.

Next, the imaged surface of the aluminium foil was rubbed with one of the fixers A or B as specified in Table 1 hereinafter to enhance the water-receptivity of the non-image areas and to make the image areas oleophilic ink-receptive. Fixer A had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |

| | |
|---|---|
| 1-phenyl-5-mercaptotetrazole | 2.0 g |
| sodium hydroxide | 5.5 g |
| water to make | 1000 ml |
| pH (20° C.) = 4 | |

The composition of Fixer B was identical to that of Fixer A with the only difference that Fixer B additionally comprised 20 g of trypsin per liter.

Each of the printing plates obtained was placed on an Heidelberg offset printing press, type GTO, marketed by HEIDELBERGER DRUCKMASCHINEN AG, D-6900 Heidelberg, West-Germany.

Each printing plate was inked with a commercially available KAST+EHINGER 123W ink and then used for printing copy sheets of paper.

The lithographic quality of each 25th print was evaluated as for its lithographic quality. The results of this evaluation are given in the following Table 1. Four levels of appreciation of the lithographic quality were attributable. The term "perfect" was used when the image printed on the paper was an exact reproduction of the silver image on the printing plate, had a perfect density, and showed no deficiencies such as pin-holes. The term "good" could be used when the image was an almost exact reproduction of the silver image on the printing plate, had an acceptable density, and showed only few deficiencies. The term "bad" was used when the printed image was a recognizable reproduction, but had an unpleasantly weak density, and showed many deficiencies. The term "very bad" was used when the printed image was unrecognizable and useless.

TABLE 1

| | Temperature of rinsing water | Fixer | Lithographic quality |
|---|---|---|---|
| Comparison A | 20° C. | A | very bad |
| Comparison B | 50° C. | A | bad |
| Comparison C | 50° C. | B (trypsin) | perfect |
| Invention | 20° C. | A | perfect |

With the "Invention" printing plate a run of 100,000 prints on paper was carried out. The quality of the last print was still perfect. No abnormal wear or decline in image sharpness was visible.

EXAMPLE 2

A photosensitive monosheet layer assemblage, which was exactly identical to that described and called "Invention" in Example 1, was exposed and developed as described in Example 1. The initiated diffusion transfer was allowed to continue for 30 s to form a silver image on the aluminium foil.

The developed monosheet layer assemblage was then dipped for a few seconds in a bath of unheated water and while still being wet placed before a slot orifice having a width of 1 m, the distance between the slot orifice and a breadthwise edge of the monosheet layer assemblage being 5 cm. An airstream was forced at a ratio of 500 m3 per hour through the slot orifice and directed onto the breadthwise edge of the monosheet layer assemblage so that the developed emulsion layer and the swollen intermediate layer were blown off from the imaged aluminium foil. These layers came loose as a whole without leaving any traces on the imaged aluminium. The loosened layers formed a cohesive mass that dried rapidly and that in contrast with other separation methods needed no filtration nor separation from the bath of unheated water.

The imaged surface of the aluminium foil was then rubbed with Fixer A described in Example 1.

The printing plate obtained was used for printing by means of the printing press and the ink described in Example 1. The 25th print on paper showed to be an exact reproduction of the silver image on the printing plate. It had a perfect density and showed no deficiencies such as pin-holes or blinding.

A run of 100,000 prints on paper was carried out with this same printing plate. The quality of the last print was still perfect. No abnormal wear or decline in image sharpness could be seen.

EXAMPLE 3

A series of photosensitive monosheet layer assemblages, which were identical except for the nature of the non-proteinic hydrophilic film-forming polymer in the water-swellable intermediate layer, were made as follows.

An aluminium foil prepared and carrying a silver-receptive stratum as described in Example 1 was coated with a water-swellable intermediate layer in such a way that the resulting dried layer had a weight of 0.33 g of non-proteinic hydrophilic film-forming polymer per m2, said composition comprising:

| | |
|---|---|
| 5% aqueous solution of non-proteinic hydrophilic film-forming polymer | 100 ml |
| Helioechtpapierrot BL (trade mark for a dye sold by BAYER AG, D-5090 Leverkusen, West-Germany) | 15 g |
| saponine | 2.5 g |
| sodium oleylmethyltauride | 1.25 g |
| demineralized water (pH-value: 5.6) | 205 ml |

The water-swellable intermediate layer was covered with a photosensitive silver chlorobromoiodide emulsion layer as described in Example 1.

Each of the thus obtained photosensitive monosheet layer assemblages was subjected to an identical procedure of exposure, DTR-development, treatment with fixer A, and printing as described in Example 1. The lithographic quality of each 25th print was evaluated as described in Example 1. The results of this evaluation are listed in Table 2.

TABLE 2

| Non-proteinic polymer used in temporary intermediate layer | Molecular weight | Alcohol/acetate units in mol % | Lithographic quality |
|---|---|---|---|
| Carboxymethyl cellulose A | 250,000 | | good |
| Carboxymethyl cellulose B | 90,000 | | good |
| Polyvinyl alcohol | 2,000 | 60/40 | perfect |
| Polyvinyl alcohol | 10,000 | 95/05 | perfect |
| Polyvinyl alcohol | 15,000 | 87/13 | good |
| Polyvinyl alcohol | 20,000 | 87/13 | bad |
| Polyvinyl alcohol | 28,000 | 70/30 | bad |
| Polyvinyl alcohol | 90,000 | 99/01 | bad |
| Polyvinyl alcohol | 125,000 | 80/20 | bad |
| Polyvinyl pyrrolidone | 40,000 | | good |

A 2% aqueous solution of carboxymethyl cellulose A has a viscosity of about 600 mPa s.

A 2% aqueous solution of carboxymethyl cellulose B has a viscosity of about 25 mPa s.

EXAMPLE 4

A series of photosensitive monosheet layer assemblages comprising a water-swellable intermediate layer, which were identical except for the coating weight of the non-proteinic hydrophilic film-forming polymer present in said water-swellable intermediate layer, were made as follows.

An aluminium foil prepared and carrying a silver-receptive stratum as described in Example 1 was coated with a water-swellable intermediate layer comprising polyvinyl alcohol as non-proteinic hydrophilic film-forming polymer, said polyvinyl alcohol having a molecular weight of 10,000 and comprising 95 mol % of vinyl alcohol units and 5 mol % of vinyl acetate units.

The water-swellable intermediate layer was covered with a photosensitive silver chlorobromoiodide emulsion layer as described in Example 1.

The only difference between the thus obtained photosensitive monosheet layer assemblages resided in the thickness of the water-swellable intermediate layer. The procedure of exposure, DTR-development, treatment with fixer A, and printing described in Example 1 was repeated for each of the layer assemblages.

The lithographic quality of each 25th print was evaluated as described in Example 1. The coating weight of the water-swellable intermediate layer and the results of this evaluation are given in Table 3. Furthermore, the sharpness of the silver image on the imaged aluminium foil and of each 25th print obtained therefrom is measured with the aid of the FOGRA Precision Measuring Strip PMS I as described in Fogra Praxis Report No 34 published by Deutsche Forschungsgesellschaft für Druck- und Reproduktionstechnik, P.O. 800469, 8000 Munich 80—W. Germany.

Table 3 also compares the yield of silver (expressed in silver nitrate). By yield of silver is meant the percent ratio by weight of transferred silver present on the aluminium foil versus the silver of the transferable silver complexes present in the emulsion layer.

TABLE 3

| Coating weight in g/m2 | Sharpness Printing plate | Sharpness Print | Yield of silver | Lithographic quality |
|---|---|---|---|---|
| 0.063 | 4 μm | 6 μm | 55% | good |
| 0.125 | 4 μm | 6 μm | 55% | good |
| 0.188 | 6 μm | 8 μm | 52% | good |
| 0.25 | 6 μm | 8 μm | 49% | perfect |
| 0.33 | 6 μm | 12 μm | 44% | good |
| 0.50 | 8 μm | 20 μm | 36% | good |
| 1.00 | 10 μm | 30 μm | 25% | bad |

EXAMPLE 5

An aluminium foil carrying a silver-receptive stratum and a water-swellable intermediate layer as described in Example 1 was coated with an unhardened photosensitive negative-working cadmium-free gelatin silver chlorobromide (3 mol % bromide) emulsion layer, the silver halide being coated in an amount corresponding to 0.50 g of silver nitrate per m2 and the gelatin content of the resulting photosensitive emulsion layer being 1.01 g/m2.

The photosensitive emulsion layer was coated with a layer of unhardened low-speed silver chloride emulsion at a ratio equivalent to 2.0 g of silver nitrate per m2, the gelatin content of the dried layer being 1.40 g/m2.

The procedure of exposure, DTR-development, treatment with fixer A, and printing described in Example 1 was followed.

The lithographic quality of the 25th print was evaluated and found to be as perfect as that of the print obtained with the "Invention" printing plate described in Example 1.

EXAMPLE 6

An aluminium foil carrying a silver-receptive stratum and a water-swellable intermediate layer as described in Example 1 was coated with an unhardened photosensitive negative-working cadmium-free gelatin silver chlorobromide (3 mol % bromide) emulsion layer, the silver halide being coated in an amount corresponding to 0.50 g of silver nitrate per m2 and the gelatin content of the resulting photosensitive emulsion layer being 1.01 g/m2.

The photosensitive emulsion layer was coated with a layer of unhardened low-speed silver chloride emulsion at a ratio equivalent to 2.0 g of silver nitrate per m2, the gelatin content of the dried layer being 1.40 g/m2.

The resulting layer assemblage was exposed and immersed in a developing solution as described in Example 1. The initiated diffusion transfer was allowed to continue for 30 s to form a silver image on the aluminium foil.

To remove the developed silver halide emulsion layers and the swollen intermediate layer from the imaged aluminium foil the monosheet layer assemblage was moistened with water and pressed after a while with its side showing the emulsion layer(s) onto a paper base coated with a hardened gelatin layer comprising a matting agent. The paper base was then peeled off while carrying along the emulsion layer(s) and the intermediate layer, which remained strongly adhering thereto.

The imaged aluminium foil was treated with fixer A and used for printing, both as described in Example 1.

The lithographic quality of the 25th print was evaluated and found to be as perfect as that of the print obtained with the "Invention" printing plate described in Example 1.

EXAMPLE 7

An unsubbed cellulose triacetate film base having a thickness of 100 μm was covered with a gelatin silver chlorobromoiodide emulsion as described in Example 1, the silver halide being coated in an amount corresponding to 2.40 g of silver nitrate per m2 and the gelatin content of the resulting photosensitive emulsion layer being 1.58 g/m2.

The resulting emulsion layer was coated with a composition for forming a water-swellable intermediate layer as described in Example 1, said composition differing from that described in Example 1 only in that a 15% aqueous solution of the same polyvinyl alcohol was used instead of a 5% aqueous solution.

The thus obtained photosensitive layer packet was stored for 2 days in a light-tight cabinet at a temperature of 57° C. and a relative humidity of 34%.

Next, the hydrophilic grained and anodized surface of an aluminium foil having a thickness of 0.20 mm and carrying a silver-receptive stratum as described in Example 1 was moistened with water in an AGFA-PROOF TR S unit, marketed by AGFA-GEVAERT, Belgium, and pressed in moistened state against the water-swellable intermediate layer of the photosensitive layer packet.

The cellulose triacetate film base was peeled off, thus leaving the water-swellable intermediate layer and the photosensitive emulsion layer adhering to the aluminium foil. It was experienced that the peeling off of the cellulose triacetate film base could be carried out immediately or could be delayed.

The thus obtained layer assemblage was exposed, DTR-developed, and treated with fixer A, all steps exactly as described in Example 1. The resulting printing plate was used for printing, also as described in Example 1.

For the evaluation of the printing results the control strips described in the above-mentioned Fogra Praxis Report No 34 were used.

Line reproduction: 6 to 8 μm
Dot reproduction: 1 to 2—99.5%
Aspect of printing plate: perfect; no fog.

EXAMPLE 8

Eight fully identical photosensitive monosheet layer assemblages D1, D2, E1, E2, F1, F2, G1, and G2 having the same composition as that described for the layer assemblage called "Invention" in Example 1 were made.

The 8 layer assemblages were exposed identically through a contact screen in a process-camera and immersed for 8 s at 25° C. in a developing solution in a CR 430 processor marketed by AGFA-GEVAERT, Belgium, the developing solution having the composition described in Example 1.

As specified in Table 4 hereinafter for each layer assemblage the developing solution was either freshly made or had been stored before use for 96 h at room temperature in a cabinet under an atmosphere having a concentration of 2500 ppm of carbon dioxide. Furthermore, the developing solution either comprised no alkanolamine in addition to the ingredients specified in Example 1 or comprised one or more alkanolamines in addition to the ingredients specified in Example 1.

In each of the layer assemblages the initiated diffusion transfer was allowed to continue for 30 s to form a silver image on the aluminium foil.

The layer assemblages were then rinsed as described in Example 1 and the bared imaged aluminium foils were treated with fixer A described in Example 1. The resulting printing plates were used for printing, also as described in Example 1.

The lithographic quality of each 25th print was evaluated according to the quality levels defined in Example 1.

For briefness sake the following acronyms are used in Table 4.

for the tertiary N,N-diethyl-ethanolamine: DEEA
for the tertiary N,N-dimethyl-ethanolamine: DMEA
for the secondary N-methyl-ethanolamine: MEA.

TABLE 4

| Layer assemblage | Age of developing solution | alkanolamine added | ml/l | Lithographic quality |
|---|---|---|---|---|
| D1 | freshly made | none | | perfect |
| D2 | cabinet | none | | bad |
| E1 | freshly made | DEEA | 50 | perfect |
| E2 | cabinet | DEEA | 50 | perfect |
| F1 | freshly made | DEEA + MEA | 30 + 30 | perfect |
| F2 | cabinet | DEEA + MEA | 30 + 30 | good |

TABLE 4-continued

| Layer assemblage | Age of developing solution | alkanolamine added | ml/l | Lithographic quality |
|---|---|---|---|---|
| G1 | freshly made | DMEA + MEA | 30 + 30 | perfect |
| G2 | cabinet | DMEA + MEA | 30 + 30 | good |

It is shown by the results in Table 4 that with increasing age of the developing solution and in the absence of an alkanolamine in said developing solution the lithographic quality of the prints obtained rapidly declines. Thanks to the presence of said alkanolamines the lifetime of the developing solution and efficiency of the diffusion transfer are enhanced substantially. As a result, an improved silver image is obtained on the aluminium foil, which when used for printing offers a high lithographic quality.

We claim:

1. Method for making lithographic aluminium offset printing plates according to the DTR-process comprising the steps of:

(a) photo-exposing a photosensitive monosheet layer assemblage comprising a hydrophilic grained and anodized aluminium foil, a water-swellable intermediate layer coated at a ratio of 0.01 to 2.0 g/m2 and comprising for at least 70% of its total weight at least one non-proteinic hydrophilic film-forming polymer, and at least one silver halide emulsion layer, (b) applying an aqueous alkaline solution to the photo-exposed silver halide emulsion layer in the presence of at least one developing agent and at least one silver halide solvent, thus reducing the photo-exposed silver halide and allowing the unreduced silver halide or complexes formed thereof to diffuse from the unexposed areas of the silver halide emulsion layer to said hydrophilic grained and anodized aluminium foil to produce from the unreduced silver halide or complexes formed thereof a silver image on said hydrophilic grained and anodized aluminium foil, and (c) separating said at least one emulsion layer and said water-swellable intermediate layer from the imaged hydrophilic grained and anodized aluminium foil.

2. A method according to claim 1, wherein in step (c) said separating is accomplished by the steps of:
   bringing the monosheet layer assemblage with its side showing said at least one emulsion layer during the period of time starting with the application of said aqueous alkaline solution and ending with said formation of a silver image on said hydrophilic grained and anodized surface in contact with a receiving means, said at least one emulsion layer and said water-swellable intermediate layer being wet with said aqueous alkaline solution having an adherence to said receiving means that is stronger than that to the imaged hydrophilic grained and anodized aluminium foil and
   peeling off said at least one emulsion layer and said water-swellable intermediate layer adhering to said receiving means from the imaged hydrophilic grained and anodized aluminium foil.

3. A method according to claim 1, wherein in step (c) said separating is accomplished by the steps of:
   removing said monosheet layer assemblage from the alkaline solution-applying means after completion of said formation of a silver image on said hydrophilic grained and anodized aluminium foil and
   detaching said at least one emulsion layer and said water-swellable intermediate layer from the imaged hydrophilic grained and anodized aluminium foil with the aid of unheated water or unheated aqueous medium.

4. A method according to claim 1, wherein in step (c) said separating is accomplished by the steps of:
   removing said monosheet layer assemblage from the alkaline solution-applying means after completion of said formation of a silver image on said hydrophilic grained and anodized aluminium foil and
   detaching said at least one emulsion layer and said water-swellable intermediate layer, while still being wet with alkaline solution or while being wet with unheated water or an unheated aqueous medium applied thereto subsequent to the removal of said monosheet layer assemblage from said alkaline solution, from the imaged hydrophilic grained and anodized aluminium foil with the aid of an air current directed onto an edge of said monosheet layer assemblage.

5. A method according to claim 3, wherein said at least one emulsion layer and said water-swellable intermediate layer are separated from the image hydrophilic grained and anodized aluminium foil by rinsing with a spray or jet of unheated water or unheated aqueous medium directed onto said at least one emulsion layer and said water-swellable intermediate layer.

6. A method according to claim 3, wherein said at least one emulsion layer and said water-swellable intermediate layer are separated from the imaged hydrophilic grained and anodized aluminium foil by pressing said monosheet layer assemblage with its side showing said at least one emulsion layer, while being moistened with unheated water or unheated aqueous medium, against a receiving sheet and said receiving sheet together with said at least one emulsion layer and said water-swellable intermediate layer, which remain strongly adhering to said receiving sheet, are peeled off from said imaged hydrophilic grained and anodized aluminium foil.

7. A method according to claim 1, wherein said aqueous alkaline solution comprises at least one alkanolamine.

8. A method according to claim 7, wherein said at least one alkanolamine is a tertiary alkanolamine having a pKa value higher than 8.5.

9. A method according to claim 7, wherein said at least one alkanolamine consists of two or more tertiary alkanolamines having a pKa value higher than 9.0.

10. A method according to claim 1, wherein said aqueous alkaline solution comprises sulphite in an amount ranging from 60 to 160 g per liter.

11. A method according to claim 1, wherein said silver image is formed on said hydrophilic grained and anodized surface under the catalytic influence of development nuclei for precipitation of silver from diffusing water-soluble silver complexes.

12. Photosensitive monosheet layer assemblage for making a lithographic aluminium printing plate according to the DTR-process, said assemblage comprising in the given sequence a hydrophilic grained and anodized aluminium foil, a silver-receptive stratum containing development nuclei for precipitation of silver from diffusing water-soluble silver complexes, and at least one silver halide emulsion layer, wherein a water-swellable intermediate layer coated at a ratio of 0.01 to 2.0 g/m2 is provided between said silver-receptive stratum and said at least one silver halide emulsion layer, said water-swellable intermediate layer comprising for at least 70% of its total weight at least one non-proteinic hydrophilic film-forming polymer.

13. A photosensitive monosheet layer assemblage according to claim 12, wherein said anodized surface of said aluminium foil has been sealed.

14. A photosensitive monosheet layer assemblage according to claim 12, wherein said at least one silver halide emulsion layer is a negative-working silver halide emulsion layer or a direct-positive silver halide emulsion layer.

15. A photosensitive monosheet layer assemblage according to claim 12, wherein said at least one silver halide emulsion layer comprises silver halide sensitized with a dye or a mixture of dyes providing a spectral sensitivity mainly in the range of 400 to 500 nm and not extending the sensitivity substantially beyond 500 nm so that the sensitivity at 530 nm is at least $10^2$ lower than that at 500 nm and that the resulting photosensitive monosheet layer assemblage can be handled in yellow safe-light conditions prior to the photo-exposure, said conditions corresponding to the light transmitted by a cut-off filter having at 500 nm a density of at least 2.5, at 530 nm a density not higher than 2.0, at 540 nm a density not higher than 1.0, at 550 nm a density not higher than 0.4, at 560 nm a density not higher than 0.2, and beyond 580 nm a density not higher than 0.1.

16. A photosensitive monosheet layer assemblage according to claim 12, wherein on top of said at least one silver halide emulsion layer there is a temporary base.

17. A photosensitive monosheet layer assemblage according to claim 16, wherein said temporary base is a cellulose triacetate film base.

18. A photosensitive monosheet layer assemblage according to claim 12, wherein said at least one non-proteinic hydrophilic film-forming polymer is polyvinyl alcohol having a molecular weight not higher than 15,000.

19. A photosensitive monosheet layer assemblage according to claim 12, wherein the anodization layer of said aluminium foil is coloured in the mass with an antihalation dye or pigment.

20. A photosensitive monosheet layer assemblage according to claim 12, wherein said hydrophilic grained and anodized aluminium foil has been provided with a very thin antihalation coating of a dye or pigment.

21. A photosensitive monosheet layer assemblage according to claim 12, wherein said at least one silver halide emulsion layer comprises a mixture of a photosensitive silver halide emulsion in which a normal latent image can be formed upon image-wise exposure and a low-speed silver halide emulsion whose speed is so low that no or almost no latent image can be formed therein.

22. A photosensitive monosheet layer assemblage according to claim 21, wherein said silver-receptive stratum incorporates at least one antihalation dye or pigment.

23. A photosensitive monosheet layer assemblage according to claim 12, wherein said at least one silver halide emulsion layer comprises a light-screening dye.

24. A photosensitive monosheet layer assemblage according to claim 12, wherein said at least one silver halide emulsion layer comprises a matting agent or spacing agent.

25. A photosensitive monosheet layer assemblage according to claim 12, wherein said water-swellable intermediate layer comprises at least one antihalation dye or pigment.

26. A photosensitive monosheet layer assemblage according to claim 12, wherein said water-swellable intermediate layer comprises at least one matting agent or spacing agent.

27. A photosensitive monosheet layer assemblage according to claim 12, wherein said assemblage comprises two silver halide emulsion layers consisting of a photosensitive silver halide emulsion layer in which a normal latent image can be formed upon image-wise exposure and a low-speed silver halide emulsion layer whose speed is so low that no or almost no latent image can be formed therein.

28. A photosensitive monosheet layer assemblage according to claim 27, wherein said low-speed silver halide emulsion layer is arranged such that it is remotest from said aluminium foil.

29. A photosensitive monosheet layer assemblage according to claim 27, wherein said low-speed silver halide emulsion is a fine-grain silver chloride-containing emulsion having a particle size in the range of 50 to 500 nm.

* * * * *